US011340710B2

(12) United States Patent
Lewis

(10) Patent No.: US 11,340,710 B2
(45) Date of Patent: *May 24, 2022

(54) VIRTUAL MOUSE

(71) Applicant: Stephen H. Lewis, New York, NJ (US)

(72) Inventor: Stephen H. Lewis, New York, NJ (US)

(73) Assignee: ARCHITECTRONICS INC., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/069,986

(22) Filed: Oct. 14, 2020

(65) Prior Publication Data

US 2021/0026459 A1    Jan. 28, 2021

Related U.S. Application Data

(63) Continuation-in-part of application No. 15/617,811, filed on Jun. 8, 2017, now Pat. No. 10,838,504.

(60) Provisional application No. 62/347,206, filed on Jun. 8, 2016.

(51) Int. Cl.
*G06F 3/01* (2006.01)
*G06F 3/0482* (2013.01)
*H03K 17/96* (2006.01)
*G06F 3/03* (2006.01)

(52) U.S. Cl.
CPC .............. *G06F 3/017* (2013.01); *G06F 3/011* (2013.01); *G06F 3/0304* (2013.01); *G06F 3/0482* (2013.01); *H03K 17/9631* (2013.01); *H03K 2217/94108* (2013.01)

(58) Field of Classification Search
CPC ........ G06F 3/017; G06F 3/0304; G06F 3/011; G06F 3/042; G06F 3/04883; G06Q 30/0601
See application file for complete search history.

(56) References Cited

U.S. PATENT DOCUMENTS

| | | |
|---|---|---|
| 5,022,170 A | 6/1991 | House |
| 5,877,748 A | 3/1999 | Redlich |
| 5,990,862 A | 11/1999 | Lewis |
| 7,273,280 B2 | 9/2007 | Smoot |
| 7,519,223 B2 | 4/2009 | Dehlin |
| 7,982,724 B2 | 7/2011 | Hill |
| 8,102,365 B2 | 1/2012 | Alten |
| 8,373,657 B2 | 2/2013 | Hildreth |
| 8,443,302 B2 | 5/2013 | Zhang |
| 8,791,800 B2 | 7/2014 | Ryhanen |
| 10,838,504 B2 | 11/2020 | Lewis |
| 2005/0168448 A1 | 8/2005 | Simpson |

(Continued)

FOREIGN PATENT DOCUMENTS

| | | |
|---|---|---|
| CN | 101699387 A | 4/2010 |
| WO | 2005064439 A2 | 7/2005 |
| WO | 2013108032 A1 | 7/2013 |

*Primary Examiner* — Towfiq Elahi
(74) *Attorney, Agent, or Firm* — Gearhart Law LLC; David Postolski, Esq.

(57) ABSTRACT

A system for interacting with a screen without touching it, comprising a source of radiating energy directed into a predefined area, at least one directionally sensitive sensor that detects the radiation when it's reflected off of an object within the predefined area, and a processor that calculates position and motion information of the object and generates therefrom image information, which it sends to a screen where it is displayed.

14 Claims, 8 Drawing Sheets

(56) References Cited

U.S. PATENT DOCUMENTS

| | | |
|---|---|---|
| 2006/0010400 A1* | 1/2006 | Dehlin .................. G06F 3/0421 |
| | | 715/856 |
| 2007/0130547 A1 | 6/2007 | Boillot |
| 2007/0220444 A1* | 9/2007 | Sunday ................ G06F 3/0488 |
| | | 715/788 |
| 2008/0121442 A1* | 5/2008 | Boer ..................... G06F 3/0421 |
| | | 178/18.09 |
| 2008/0256494 A1 | 10/2008 | Greenfield |
| 2010/0222110 A1 | 9/2010 | Kim |
| 2011/0221676 A1 | 9/2011 | Liu |
| 2011/0285666 A1 | 11/2011 | Poupyrev |
| 2012/0105375 A1* | 5/2012 | Yamada ............. G06F 3/04883 |
| | | 345/175 |
| 2012/0135247 A1 | 5/2012 | Lee |
| 2012/0235892 A1 | 9/2012 | Narendra |
| 2013/0057515 A1 | 3/2013 | Wilson |
| 2013/0194240 A1 | 8/2013 | Kwong |
| 2013/0229491 A1* | 9/2013 | Kim ....................... G06F 3/017 |
| | | 348/46 |
| 2014/0253432 A1 | 9/2014 | Ferguson |
| 2016/0034108 A1 | 2/2016 | Alshine |
| 2017/0357330 A1 | 12/2017 | Lewis |
| 2018/0005005 A1 | 1/2018 | He et al. |
| 2021/0026459 A1 | 1/2021 | Lewis |

\* cited by examiner

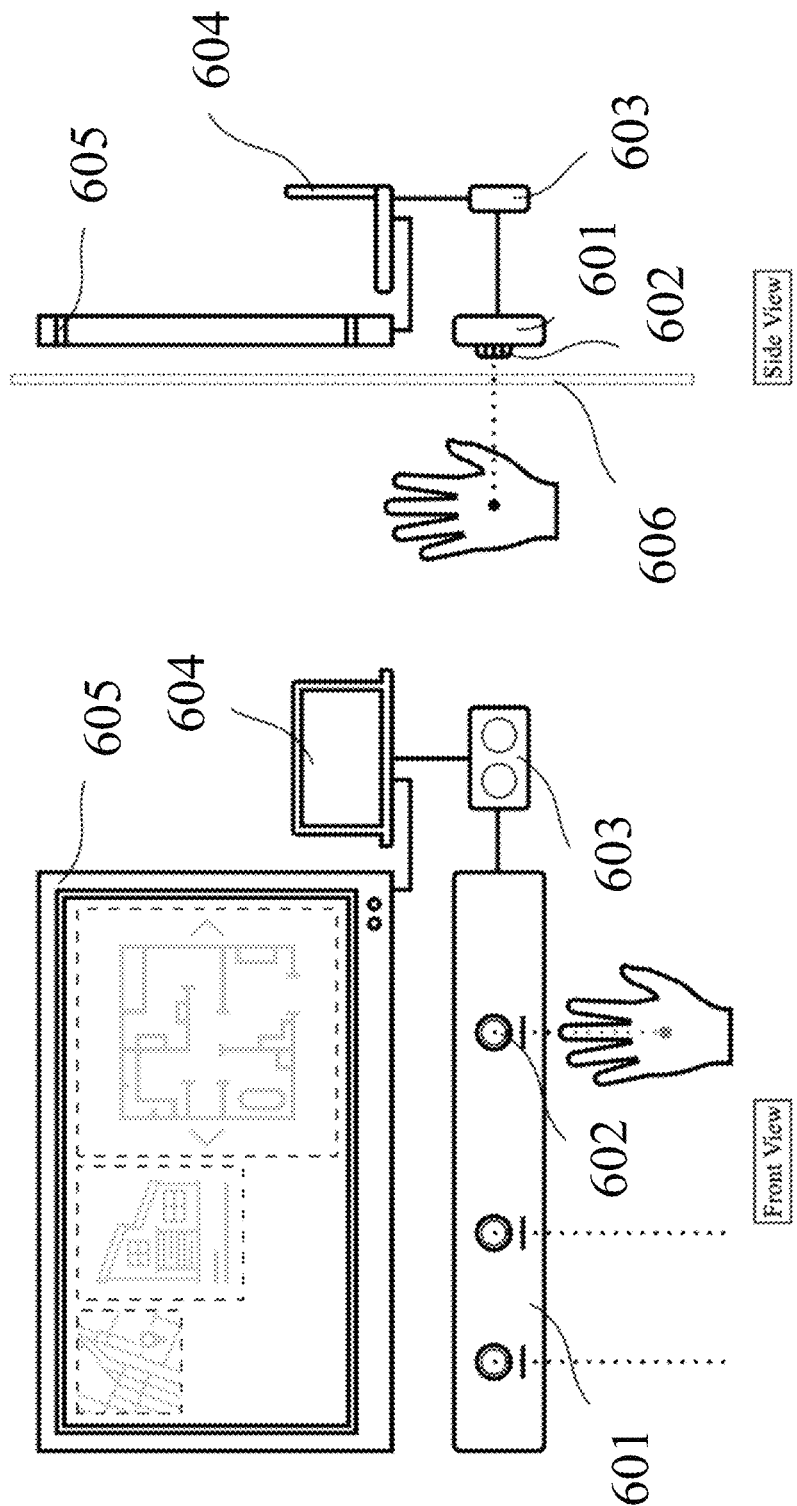

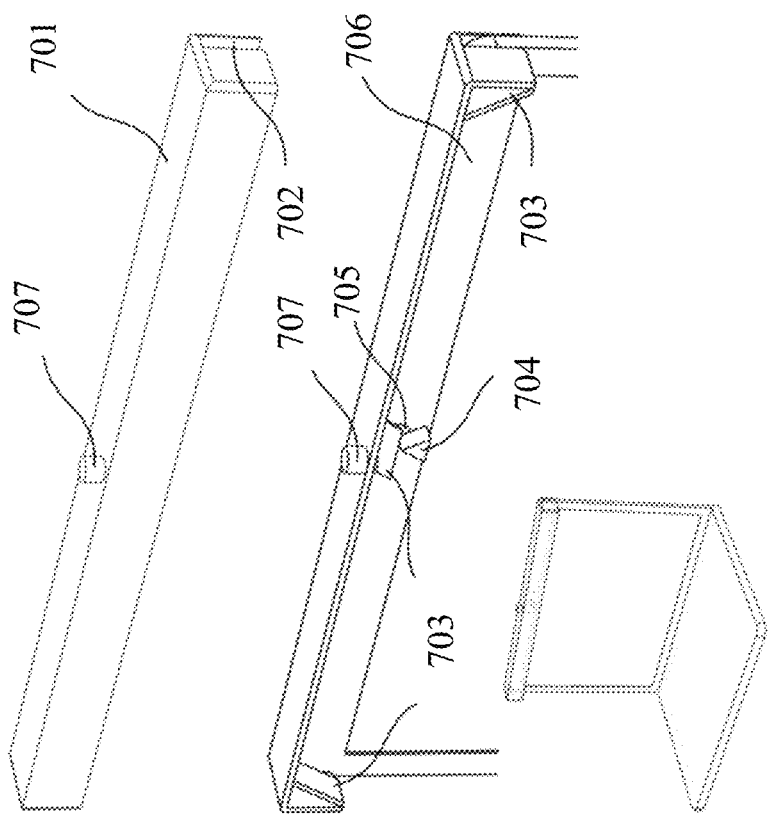
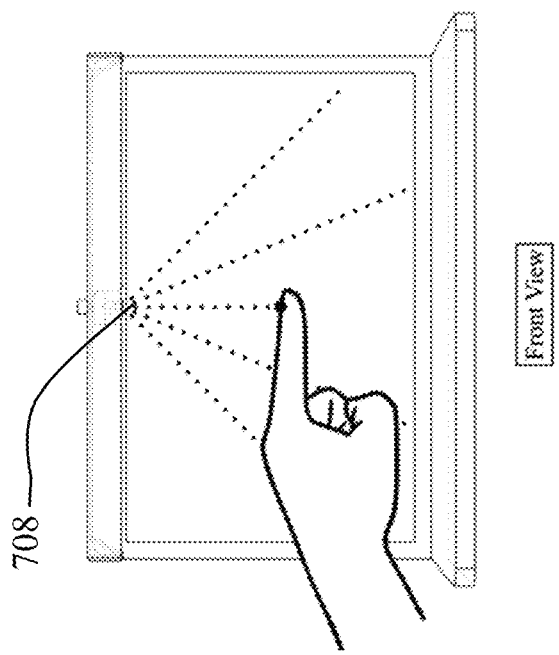
FIG. 7A
FIG. 7B

VIRTUAL MOUSE

CLAIM OF PRIORITY

This application is a United States non-provisional CIP application and claims priority to U.S. application Ser. No. 15/617,811 filed Jun. 8, 2017 which claims priority to U.S. Provisional Patent Application No. 62/347,206, filed Jun. 8, 2016, all of which are incorporated by reference herein in their entirety.

FIELD OF THE EMBODIMENTS

This invention relates to a system for providing an interactive window display for individuals who are walking past a storefront display.

BACKGROUND OF THE EMBODIMENTS

Glass-fronted stores on the street have been a feature of urban environments for centuries. As time has gone on, these displays have gotten larger, and have become more ubiquitous throughout retail. With this development of large plate glass surfaces, these displays, whether found on a storefront on a street, or in an indoor mall, have provided for a lot of direct communication between passersby and the store. Despite this golden opportunity to provide an interactive experience for passersby, the storefront remains a one-way street, displaying objects or images which a passerby can view, but not interact with. Given the explosion of computing devices making their way into many other industries, this lack of integration in the storefront seems puzzling.

There have been some isolated attempts to take advantage of this opportunity, that is, to exploit the opportunity to engage with a passerby. One way in which this is attempted is to place sensors outside the storefront window. These sensors are used to interpret user activity, and then provide an interactive experience. However, this approach results in the sensors being exposed to the elements, and leaves them vulnerable to vandalism. Further, there exist large technological and financial challenges with passing control data through or around the glass to interior computing devices, and the like.

Others have attempted to solve this problem by placing a special film on the inside of the glass and using a rear-projected image and capacitive or similar touch-sensing systems. While this seems like an attractive option, there are a number of drawbacks to this approach. First, users must physically touch the outside of the glass to engage the capacitive sensing technology. Further, the display image must be rear-projected onto the film, which is an inferior technology as the image quality suffers greatly and is adversely affected by sunlight and reflections on the glass itself. Moreover, the image cannot be displayed on a monitor which is inside the window, and is part of a closed system which is not connected to other aspects of the holistic window area, limiting the amount of interaction possible.

Examples of Related Art are Described Below:

E Display, Inc. offers a storefront window projection. The main element of this solution is a rear-projection film that can be mounted on any clear surface from inside to turn a store front window into a dynamic presentation screen. SSI Displays also offers a similar solution.

Screen Solutions International, through their website, offers another product where a transparent capacitive screen is attached to a controller. This screen may be retrofitted to a number of places, such as a television or window.

United States Patent Publication No. 2016/0034108 pertains to system and method for operating a computer device using an interface device. The interface device includes at least one emitter of IR light/radiation with a peak intensity of between 780 nm and 1000 nm and at least one detector sensitive to IR light/radiation with a wavelength of 780 nm to 1000 nm wherein the user interface device is located adjacent to transparent, glass. The IR emitter directs IR radiation through the glass, wherein the IR radiation is reflected back through the glass to the IR detector and wherein the IR detector transforms the IR radiation into an electronic signal. The method includes the step of activating the detector from a front side of the glass. According to this implementation, the user must touch the glass directly.

None of the art described above addresses all of the issues that the present invention does.

Other solutions exist where a user's smartphone is used to control a standard screen set up in a window, however these solutions do not provide a responsive user interface where the user engages, directly and instantaneously, with their actions and the content on the screen.

SUMMARY

A system for interacting with a screen without touching it, comprising a source of radiating energy directed into a predefined area, at least one directionally sensitive sensor that detects the radiation when it's reflected off of an object within the predefined area, and a processor that calculates position and motion information of the object and generates therefrom image information, which it sends to a screen where it is displayed.

BRIEF DESCRIPTION OF THE DRAWINGS

FIGS. 6A, 6B show front and side views of an interactive system, according to an embodiment of the present invention.

FIGS. 7A, 7B show front and perspective views of an interactive system, according to an embodiment of the present invention.

DETAILED DESCRIPTION

Figure 1:
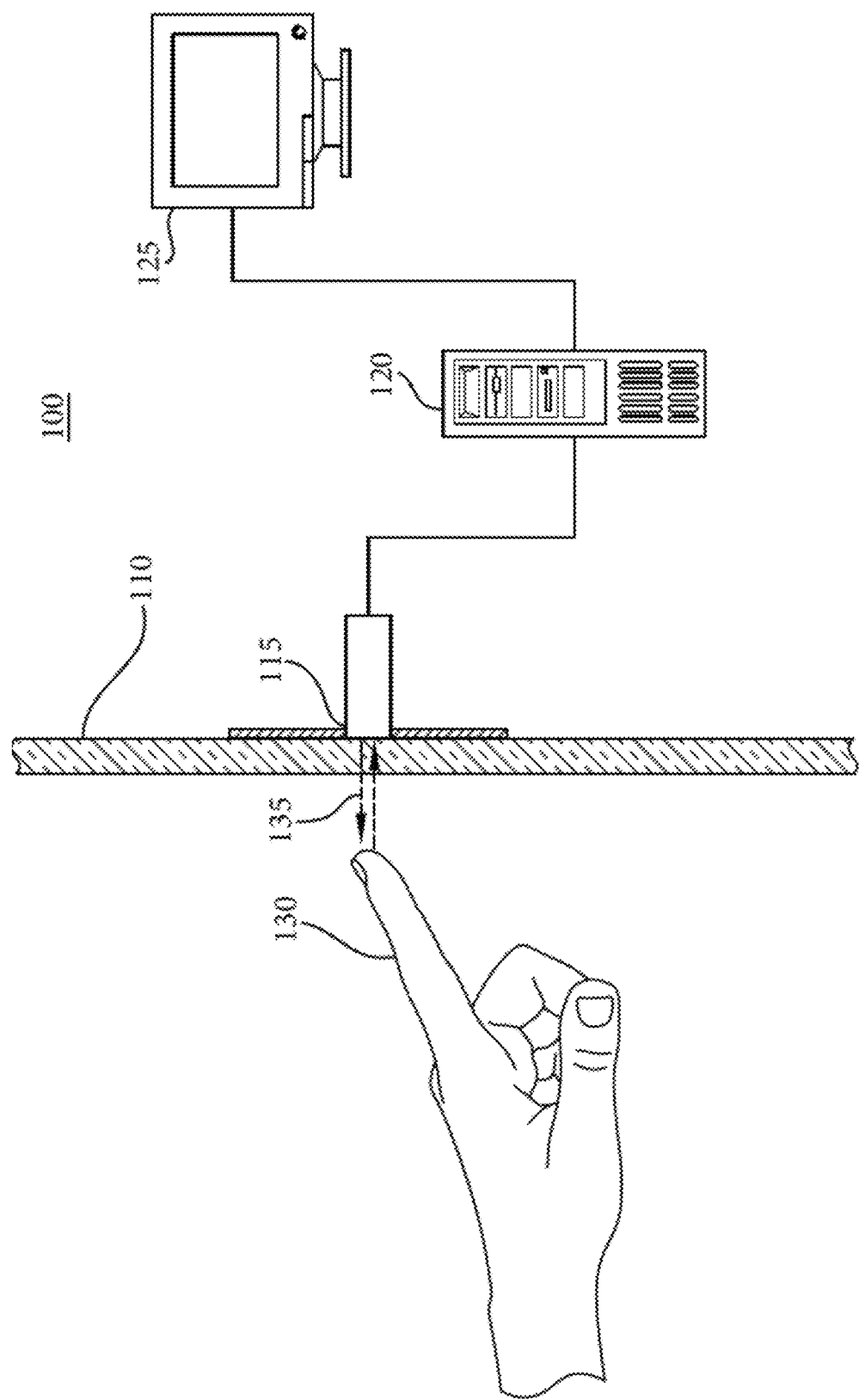
FIG. 1 shows a side view of an interactive system, according to an embodiment of the present invention.

Embodiments of the present invention will now be described with reference to the drawings. Identical elements in the various figures are identified with the same reference numerals. The embodiments are provided by way of explanation of the present invention, which is not intended to be limited thereto. Rather, the scope of the invention is defined by the claims. In fact, those of ordinary skill in the art may appreciate upon reading the present specification and viewing the present drawings that various modifications and variations can be made thereto.

Referring now to FIG. 1, an interactive system 100 is illustratively depicted, in accordance with an embodiment of the present invention.

According to an embodiment, the system 100 includes a window or other transparent medium 110, visual sensors 115 located within the window 110, a computing device 120 coupled to the visual sensors 115, and a display screen 125 coupled to the computing device 120.

According to an embodiment, system permits users 130 who are outside a glass-fronted store window 110 to control images displayed on a computer screen 125 located on the side of the window 110 opposite the user 130. The users' 130 gestures and/or body movements are detected and interpreted by sensors. The sensors may be coupled to the window 110 and/or wholly located on the inside of the window 110.

According to an embodiment, the computing device 120 includes at least one processor and memory and is configured to execute a set of computer-readable instructions, which include instructions for controlling images on an external screen 125, and instructions for controlling at least one integrated object. According to an embodiment, the computing device includes at least one instruction, wherein the at least one instruction indicates to a user how to operate the system. According to an embodiment, the at least one movement of the at least one human appendage is associated with a particular instruction.

According to an embodiment, no sensors 115 and/or other equipment are positioned on the outside of the window 110 on the side of the window 110 in which the user 130 is positioned. This configuration enables users 130 to interact with the system 100 without touching the glass of the storefront window 110. In this way, the user 130 can move from "viewer" to "participant," and engage in a more meaningful interaction with the goods or services provided by the store owner. Not however limited to the goods and services provided by the store owner or lessee, as any goods or services can be "advertised" using this system, so the owner/lessee can profit by having the store window as "street real estate" to be used in any way they see fit.

According to an embodiment, the user has the capability of controlling one or more of motorized displays, lights, the movement of images on a display, etc.

According to an embodiment, the system 100 is capable of sending back ordinary non-proprietary instructions to the computing device 120, so that anyone can implement the interaction as they see fit. For example, according to an embodiment, simulated keystrokes may be sent back to the computing device 120 which can be used by any program to effect visual changes.

According to an embodiment, the display screen 125 is against the window 110. According to another embodiment, the display screen 125 is projected onto the window 110. According to yet another embodiment, the display screen 125 is at a not up against the window 110 or projected on the window 110 and is at a distance from the window 110, as is shown in FIG. 1. In contrast to the existing methods of "touch screen" interaction for storefront windows, the proposed invention disassociates the area of user gesture control from the plane of the image displayed on the display 125. This provides flexibility to the designer of the interactive experience to be able to position the images or objects to be controlled anywhere in the space of the inner window area, and on any size screen on the display 125.

While the present system 100 may be installed in a number of locations, preferable locations include, but are not limited to: a streetscape, a mallscape, a museum interior, proximate to museum exhibits, incorporated into museum exhibits, dioramas, etc. Further, the present invention can enable store owners to advertise a variety of products, or advertise a cycle of individual products, giving users the ability to control the content on the display 125.

In a preferred embodiment, the present invention provides a means to offer two-way communication. In these circumstances, storefronts could also provide entertainment to passersby such as, but not limited to, interactive games, educational experiences, news feeds, location information, and other related services. Users can engage with images and other controllable physical and virtual display elements from outside the display.

According to an embodiment, the sensors 115 use structured light as the medium of sensing a user's gestures. This structured light may have a wavelength in the visible or infrared spectrum, but it may also contain light in other regions of the electromagnetic spectrum. This allows the structured light to pass through a pane of glass 110 (or other material) and be reflected back through the glass 110 to the sensor 115 with little degradation. By "structured" light, it is meant that the light is modulated to add a "signature" to it. These methods substantially improve the ability of the sensor 115 to determine that light coming back from the outside of the glass 110 is the same light that was transmitted from inside the glass 110 by the sensor 115 system, as opposed to ambient light from other sources like sunlight, exterior lights, or reflections. It is noted, however, that other types of sensors may also be used while maintaining the spirit of the present invention.

This structuring of light can be achieved by different methods. Such methods include restricting the wavelength of light to specific ranges, restricting the wavelength of light to a particular frequency, and/or pulsing the light with a given modulation pattern. In the case of wavelength restriction, for example, the source light of the sensor system may be generated as monochromatic light or dichomatic light, where this light is in a very narrow frequency band. In those embodiments, the sensor 115 is tuned to that frequency in particular, and ignores other frequencies that may enter through the window 110. This can be achieved using one or more filters or through other, not explicitly stated methods.

In alternative embodiments, the light of the present invention may be pulsed or modulated in a unique way. For example, the light could be displayed in a series of very rapid bursts or displayed in another particular pattern. Preferably, the sensor of the present invention is electronically tuned to detect incoming reflected light from outside the glass that matches the light patterns emanating from the source. This method effectively screens out stray light coming from the outside, which does not possess the signature patterns, and focuses the sensor 115 system only on its source's light emissions. Thus the source/sensor system can very accurately focus on and determine the specific actions of the nearby user 130, while also ignoring any extraneous light sources as well as light generated by reflections from nearby objects, as distinguished from reflections of the structured light source. One way in which these reflections would be distinguishable would be the strength of the reflection. That is, the reflections of the structured light would be identifiably stronger than that of the ambient light.

Figure 2:
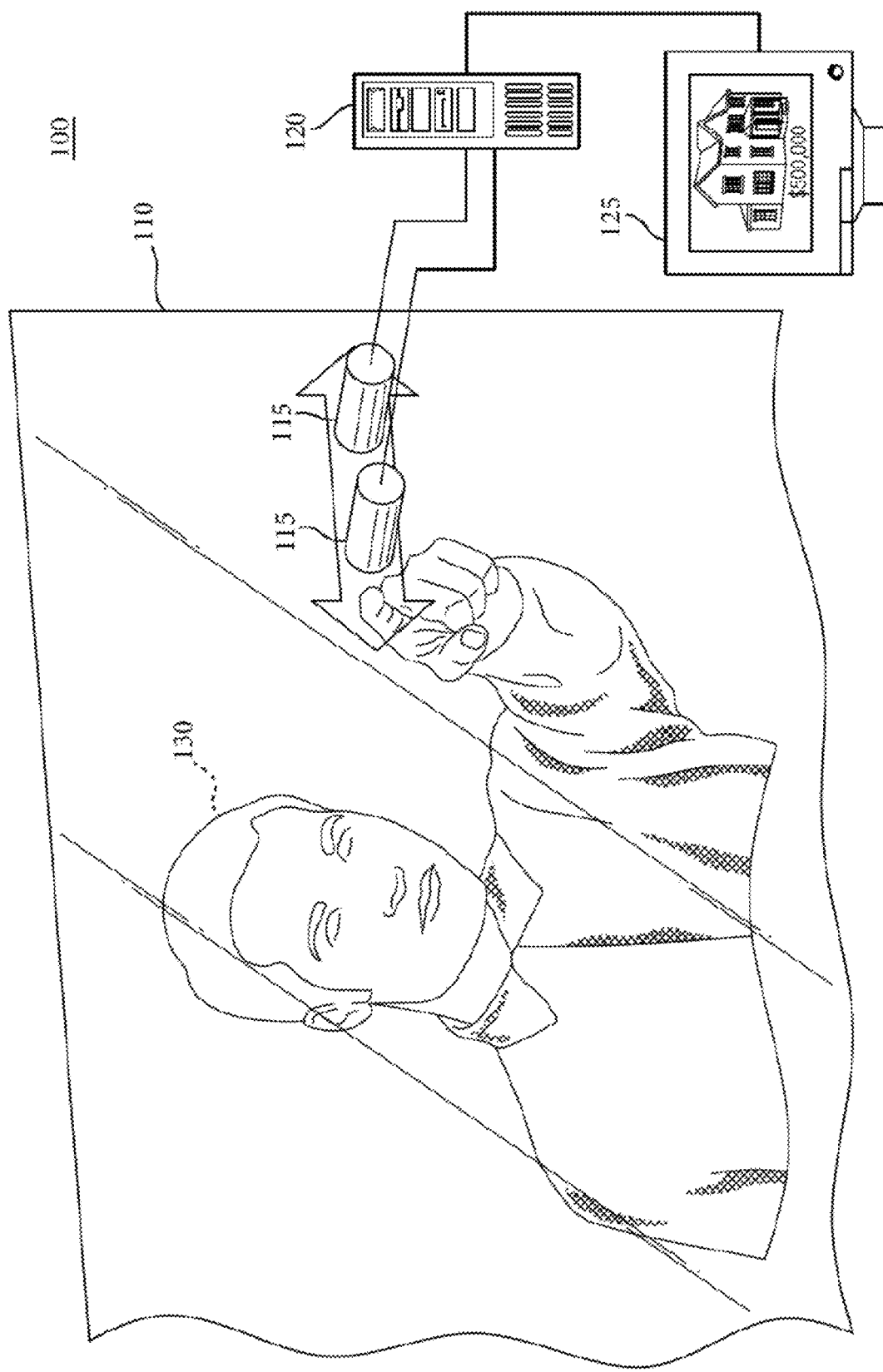
FIG. 2 is a rear perspective view of an interactive system while in use by a human user, according to an embodiment of the present invention.
Figure 3:
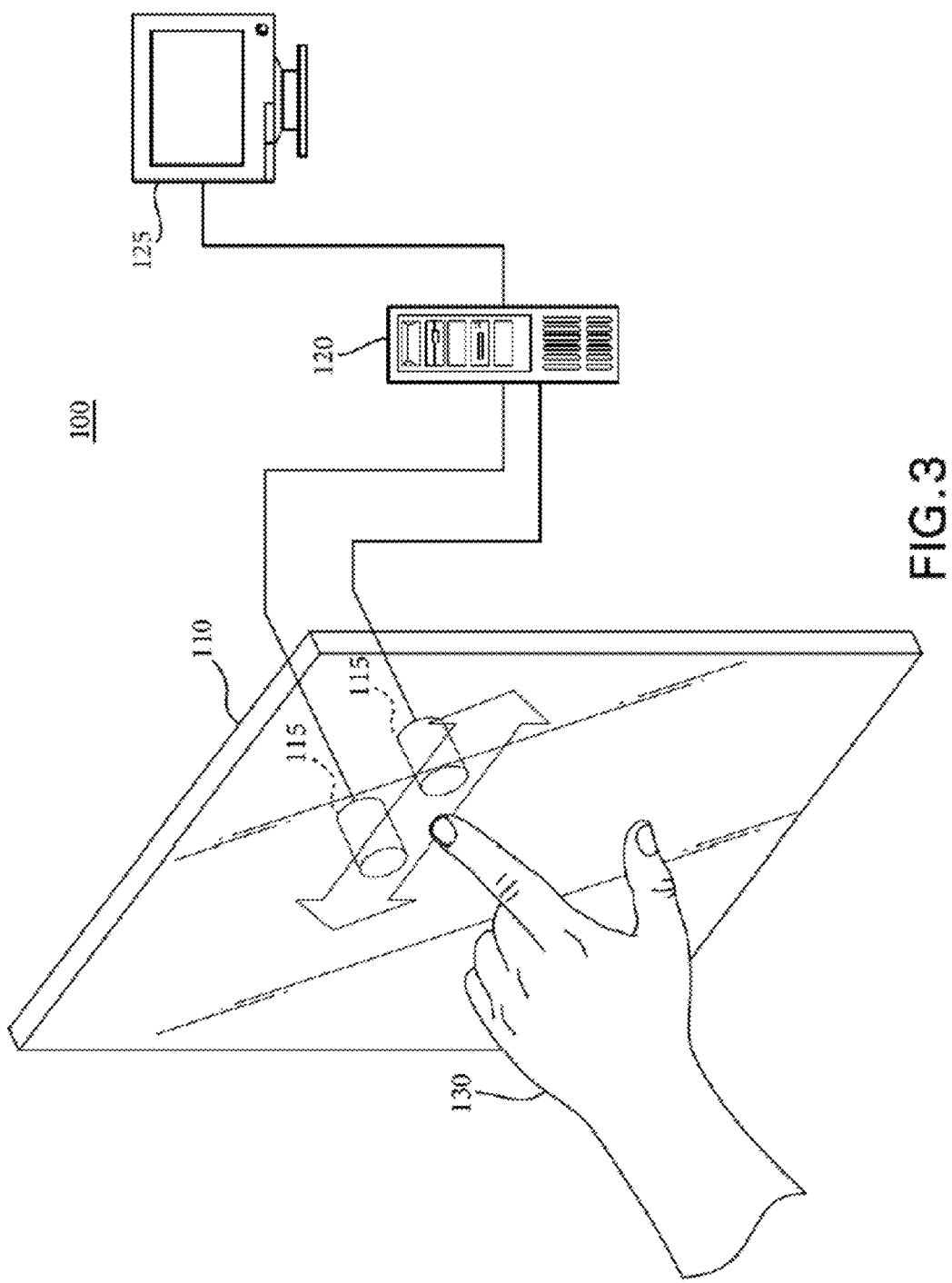
FIG. 3 is a front perspective view of an interactive system, according to an embodiment of the present invention.

Referring now to FIGS. 2-3, a rear perspective view (FIG. 2) and a front perspective view (FIG. 3) of an interactive system 100, while in use by a human user 130, are illustratively depicted, in accordance with various embodiments.

As shown, multiple light emitters and reflection-sensing photocells 115 may be used. This embodiment is able to determine whether a user's 130 finger is near a particular area. For example, this area may correspond to standard ways of controlling a computer, as one does using a keyboard or mouse. Decals on the inside of the glass may help guide the user toward these zones. In some embodiments, five zones may be defined which correspond to left, right, up, down, and select. Decals are preferred position indicators as many types of light generated by the sensors 115 can pass through a decal uninhibited, making it possible to provide simple and direct graphical guide for the user without degrading the sensing system.

In embodiments, a standard or infrared camera 115 may be placed behind the glass 110, facing the outside of the display. The system 100 adds "structure" and "signature" characteristics to the lighting 135 (shown in FIG. 1) which emanates from inside the store window 110, such that the camera is made to focus only on the nearby user 130, and not the background imagery of other passersby, cars, or other moving objects. This greatly improves the ability of the present embodiment to focus on the most relevant aspects of the user's movements. In this embodiment, the light signal sensed by the camera can be modulated electronically using the methods described previously.

In yet another embodiment, alternatively or in addition to a user controlling images and menu choices on an external screen without touching the screen, movements of physical objects equipped with motors operatively coupled to computer 120 can be similarly controlled. In this embodiment, users may activate a variety of movements and actions of the objects using finger, hand, and/or body gestures.

In embodiments, gestures using only a single finger may allow simple interaction with a screen without touching it. Here for example, broad mouse control may be enabled and a mouse click can be signaled. The system may thus allow a user to select large menu targets, for example, in an area of 20 by 20 pixels or larger for a menu item.

To do so, the user approaches a screen which may be of any desired size, such as a 9 by 12 inch tablet or a 32 inch monitor, for example. The screen may be mounted, such as on a stand or on a wall, and its setup and appearance are preferably arranged to suggest it has "kiosk" functionality. The user controls the mouse with an index finger pointing across a field in space, perhaps 3 to 12 inches away from the screen surface, and perhaps 24 inches across by 12 to 16 inches in height, mapped to the width and height of the display. For screens larger than 24 by 16, finger movement in space more distant from the screen surface may be desirable, for example 24 inches distant for larger monitors. Moving the pointed finger in the space in front of the screen causes the cursor on the screen to track across the screen. In an embodiment, the pointing index finger may be held rigid to control movement of a virtual mouse while moving the hand. "Clicking" may then be achieved by flexing the index finger quickly, for example.

This embodiment can be arranged to work with a variety of monitors or tablets, for example by mounting one or more sensors and detectors to a frame, and using a clamp to attach the frame to the device having the screen. Such an arrangement may be configured using a USB port or Bluetooth pairing, for example. Plug and play recognition of the embodiment as a mouse may also be implemented. Advantageously, such an arrangement can work through glass, as in a store window display, but this is not a requirement.

Figure 4B:
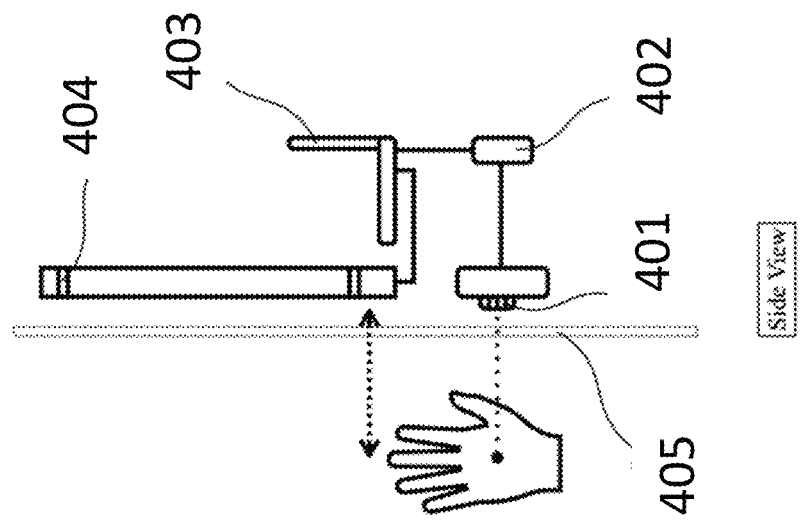
FIGS. 4A, 4B show front and side views of an interactive system, according to an embodiment of the present invention.
Figure 4A:
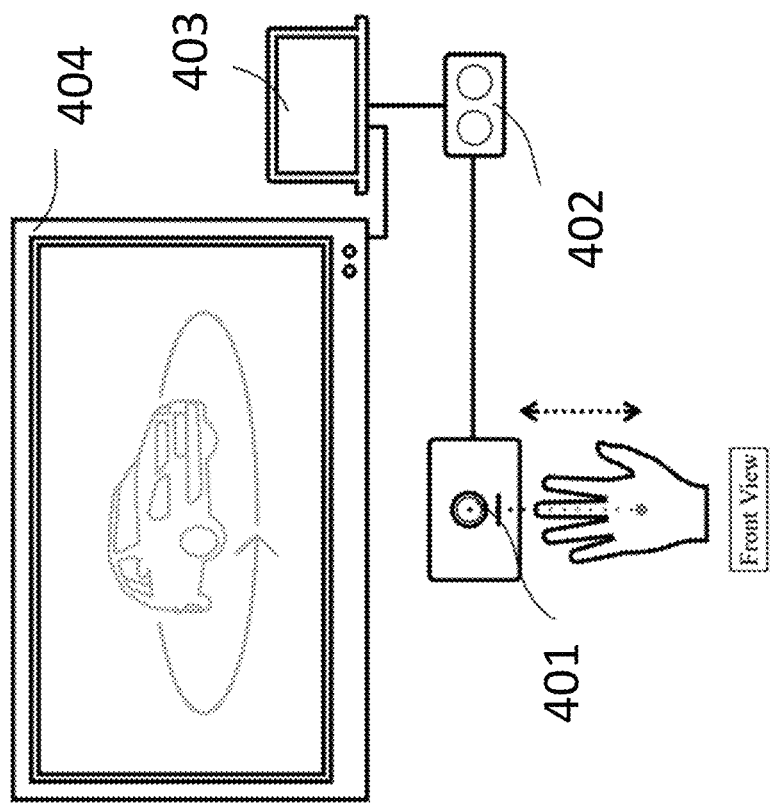

Turning now to FIGS. 4A and 4B, illustrated are front and side views, respectively, of an embodiment that comprises a distance ranging infrared sensor 401, an interface board 402 to track the sensor output and send tracking information to a computer, the computer 403, and a display 404. The distance ranging sensor 401 is capable of operating through single or multiple glass panes of a window 405 as are commonly found in a store front, or simply in the air. This embodiment provides "no touch" control of a dynamic image on the computer screen 404 simply by moving a hand closer or farther from the sensor to produce dynamic distance information. The dynamic distance information can be used in many ways, one of which is to control the rotation of an object displayed on the screen in a 3D rendering. In a usage example, a user may use their hand to rotate a 3D image of a necklace displayed in a jewelry store window to see it from different angles. In another usage example, outside a car showroom a user may control a 3D view of a car to view it from many angles, as shown in the figure.

Notably, the "no touch" aspect of this system is advantageous in situations where users are reluctant to touch a glass surface or a touch screen in a public installation because of known or perceived exposure of those surfaces to contaminants. In particular, the herein disclosed virtual mouse is useful in any touch screen scenario to replace the touch screen with a "non touch screen", specifically in the context of a situation of local or national concern over adverse health conditions which might be transmitted through multiple people touching the same surface.

Figures 5A, 5B:
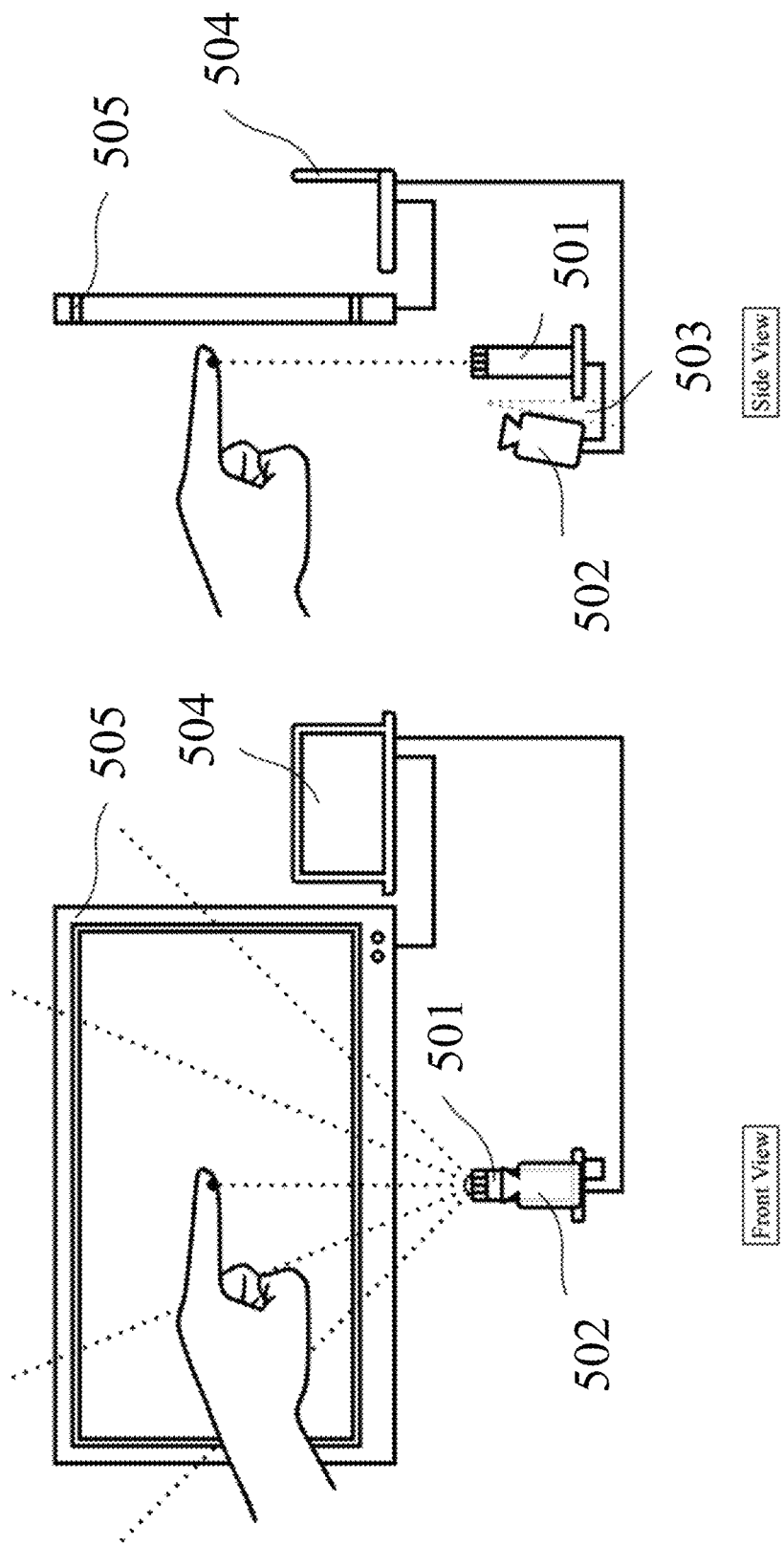
FIGS. 5A, 5B show front and side views of an interactive system, according to an embodiment of the present invention.

As illustrated in FIGS. 5A and 5B, front and side views, respectively, of another exemplary embodiment is also functional through a pane of glass or directly, for example near a computer screen in a typical "kiosk" arrangement that includes the computer screen mounted on a stand or a wall, or disposed on a desk in a public location. Light from at least one laser 501 is arranged to define a plane of laser light parallel to the screen 505, or a pane of glass of a storefront. This may be done for example by splitting the laser light into many lines, or by sweeping the laser through an angle at a high frequency, where the location of the laser light source (which may be one or more mirrors reflecting light from the laser) and the sweep angle are sufficient to define a plane that a user's finger can penetrate and move in. A select area of the light plane may cover or be mapped to the whole screen, or a relevant part of the screen. Preferably, the laser light is directed away from the user and other people, so it doesn't shine into anyone's eyes. The system is preferably arranged to define the plane of laser light at a distance of 1 to 5 inches from the glass or screen, although this specific distance range is not a requirement. Thereby, this arrangement displays a prominent monochromatic laser spot onto a user's finger when the finger crosses the plane defined by the laser light. The light spot can be easily distinguished from a dynamic field of view in a public location to enable accurate tracking of the finger. At least one camera 502 may be mounted to face toward an edge of the plane in a vertical direction at a small angle 503 to the plane of laser light. Another camera may be mounted to face toward an edge of the plane at a small angle in a horizontal direction (not shown), to provide at least two vantage points from which the position of the dot on the user's finger can be triangulated by the computer 504. Alternatively, one or more mirrors may be used to reflect image(s) of the dot to the camera, so there are at least two vantage points from which the position of the dot can be triangulated by the computer 504. The position of the dot is used by the computer to cause the screen 505 to manipulate an image displayed on the screen. The laser and camera may also be disposed inside a glass storefront window facing toward the glass at a small angle almost parallel to the glass surface. The laser light may be refracted outward through the window glass, and the image seen by the camera may be refracted inward through the window glass in a similar fashion, so that neither the laser nor the camera are disposed outside the glass.

The tracking of the laser dot on the illuminated finger is done by triangulating the position of the dot from images provided by the cameras, which provide image data continually or periodically at a high frequency, such as 100 Hz, that is sent to the computer. A program running on the computer uses the image data to triangulate the position and motion of the dot and generate x and y coordinates of the dot on the finger relative to the screen or glass. The computer may use the generated coordinates to cause a cursor image to be displayed on the screen or glass, so the user has an interactive sense of controlling the cursor using a virtual mouse. A "click" of the virtual mouse may be realized by the user rapidly moving the fingertip, causing a corresponding rapid movement of the dot on the finger, resulting in rapidly changing dot position data that can be interpreted by the computer as a clicking motion. Alternatively, a second plane of laser light may be generated in a manner similar to the first plane, parallel to and near the first plane, so that the rapid motion of the finger causes the fingertip to briefly cross the second plane to cause a second dot to appear on the finger, which can be interpreted by the computer as a clicking motion.

Another embodiment, illustrated in FIGS. 6A and 6B, uses data from multiple sensors to control structured menus. This implementation uses a plurality of sensors 602, one for each menu level and preferably at least three, mounted in a sensor block 601 to control "nested menus" displayed on the screen or glass, thereby enabling the user to navigate through choices associated with a controlled entity, for example by displaying images and/or information of items stored in a database. Illustratively, the user can "page or scroll" through choices in a top level menu (shown on the left side of screen 605), such as by waving or making an appropriate predetermined gesture in front of a top level sensor (the sensor toward the left side of sensor block 601). The gesture and its position may be identified by cameras 603, and conveyed to computer 604, which controls what is displayed on screen 605. For example, making appropriate gestures in front of the top level sensor may display a list of top level choices on the screen, and allow the user to scroll through the choices and select a desired one. The user can then make appropriate gestures in front of the second level sensor (the sensor nearest the center of sensor block 601) to display a list of second level choices, scroll through the choices, and make a second level selection. Likewise, the user can then make appropriate gestures in front of the third level sensor (the sensor nearest the right side of sensor block 601), to display a list of third level choices, scroll through the list, and make a third level selection. Thus, each menu level selection causes further information of the selection to be displayed in another menu "below" it in the menuing hierarchy. A simple example would be in a real estate office window display, where the top level menu choices may correspond to neighborhoods covered by the office, the second level menu may show property listings in the chosen neighborhood, and the third level menu may show pictures and information of a particular selected property. Thereby, it is easy to use nested menus to access information of an arbitrarily large number of properties, including data and images of each property stored in a database.

Figure 8B:
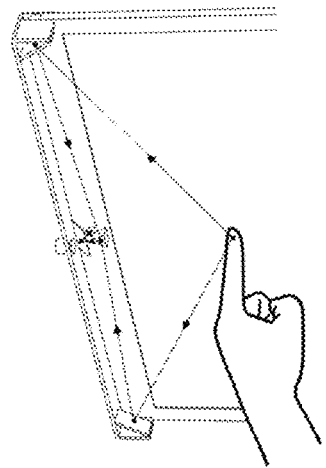
FIGS. 8A, 8B illustrate aspects of an interactive system, according to an embodiment of the present invention.
Figure 8A:
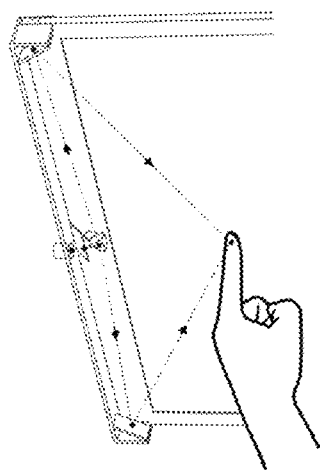

A final exemplary embodiment includes the use of optical add-on devices for use with a laptop having a webcam for finger tracking. Two arrangements will be described, with and without a laser. As illustrated in FIGS. 7A and 7B, in a first implementation (without a laser), a clip-on optical device is coupled to the top of a typical laptop screen 706 when the laptop is open. The device may include a body 701 that holds the other elements in place. A clamp 702 is used to removably couple the device to the top of the laptop screen, and an adjustment knob 707 may be provided to adjust the placement of the device on the laptop screen. A plurality of mirrors 703 reflect light into the webcam 705 of the laptop to gather information about the location of a finger hovering over the screen at a distance, preferably 1 to 3 inches from the screen, although other distances may be used. One of the mirrors 703 is disposed in front of the webcam 705 to deflect the view of the webcam downward. A beamsplitter 704 bisects the camera view left and right, and two mirrors 703 disposed at the corners of the upper part of the laptop screen deflect the view downward and toward the center of the screen from the top left and top right corners. Thus using the existing webcam of a laptop, two images of a finger pointed at the screen are provided to the webcam from two different vantage points (i.e., from the locations of the mirrors in the corners). From the images, a position of the finger can be triangulated and x and y coordinates relative to a select or default corner of the screen can be calculated by the laptop. The user's finger can also be tracked as it moves in front of the laptop screen, and the laptop can determine what elements displayed on the screen the finger is pointing to. A distance of the fingertip from the screen can also be determined, which can be used to interpret a "select" gesture. FIG. 8A illustrates how the webcam has two lines of sight that allow it to cover essentially the entire laptop screen, including the location of the finger, from the two corner vantage points. FIG. 8B illustrates how the finger, illuminated by ambient light or light from the screen for example, can cause light impinging on the finger to be reflected back to the camera along two optical paths, from which the x and y coordinates of the position of the fingertip can be calculated.

Alternatively or additionally, a laser 708 may be introduced into the system, also pointing downward from the frame. The laser light may be either split into a plurality of beams or be made to sweep rapidly back and forth through an angle to define a plane parallel to the screen. The laser will cause a prominent dot to appear on the finger when the finger pierces the plane. All other aspects of the system remain the same. The dot may enable the laptop to more quickly and accurately calculate the coordinates of the finger and track its movements than can be achieved using just ambient or screen generated light.

Thus, the present invention improves upon the prior art by placing only its sensing devices against the glass 110 (or other transparent material), for example as a storefront window, which then communicate with a screen 125 which can be located anywhere inside the storefront. This greatly enhances the visibility of the screen 125, and affords a designer greater flexibility in designing the window display, due in part to the ability to place the screen 125 at any location. Further, the present invention uses different methods of applying a "signature" to the light source, so that it is not restricted to infrared frequencies. Additionally, the present invention alternatively uses a camera to determine the shape and position of a user's appendage (e.g., a finger) and track its movements. Further, the present invention does not require that the user touch the glass or other tracking surface, which is a large departure from the prior art which generally requires the user to touch the tracking surface.

When introducing elements of the present disclosure or the embodiment(s) thereof, the articles "a," "an," and "the" are intended to mean that there are one or more of the elements. Similarly, the adjective "another," when used to introduce an element, is intended to mean one or more elements. The terms "including" and "having" are intended to be inclusive such that there may be additional elements other than the listed elements.

Although this invention has been described with a certain degree of particularity, it is to be understood that the present disclosure has been made only by way of illustration and that numerous changes in the details of construction and arrangement of parts may be resorted to without departing from the spirit and the scope of the invention.

What is claimed is:

1. A system for interacting with a screen without touching it, the system comprising:
   a source of laser energy directed into a predefined area;
   a motor that causes the source of laser energy to sweep through an angle to define a plane, wherein the laser energy is configured to cause a prominent dot to appear on an object where the object crosses the plane;
   at least one directionally sensitive sensor configured as a camera that is configured to:
      detect a direction to the dot and a motion of the dot; and
      send, to a computing processor, information of a location from which the laser energy is reflected;
   the computing processor that uses the location information to calculate a position and a motion of the object from which the laser energy was reflected, and generate image information based on the calculated position and motion, and send the image information to a screen for display; and
   the screen that displays an image based on the image information received from the computing processor.

2. The system of claim 1, further comprising;
   a plurality of laser beam splitting mirrors configured to define the plane based on static reflections of a split laser beam.

3. The system of claim 1, further comprising:
   a mirror coupled to the motor, wherein the plane is defined by a laser beam reflecting off of the mirror as the source of laser energy.

4. The system of claim 1, further comprising:
   a computer program running on the processor that, based on information of the direction to the dot and the motion of the dot from at least two vantage points, calculates coordinates in the plane based on the direction and motion information, and generates the image information based on the calculated coordinates.

5. The system of claim 4, wherein the image displayed on the screen based on the image information is a cursor that tracks the position and motion of the dot on the object to realize a virtual mouse.

6. The system of claim 5, wherein the object on which the dot appears is a finger of a user, and a rapid movement of the finger causes a virtual mouse click.

7. The system of claim 1, further comprising a sensor block containing a plurality of sensors in an ordered arrangement, wherein a direction and movement of the object in front of a select one of the sensors of the plurality of sensors causes the display on the screen of a particular menu, a listing of menu choices, and a selection of one of the listed choices from the listing of menu choices, the particular menu being part of a nested menu hierarchy, and wherein the particular menu in the hierarchy corresponds to the selected sensor in the ordered arrangement of sensors.

8. The system of claim 1, further comprising:
   a frame;
   a clamp coupled to the frame for removably coupling the frame to a screen of an open laptop that has a laptop webcam as the sensor and a laptop processor as the processor;
   a first mirror attached to the frame near a first end of the frame, disposed in the frame at a position and angle that, when the frame is coupled to the laptop screen, place the first mirror near a first corner of the top of the laptop screen at an angle that reflects an image of a plane in front of the center of the laptop screen that covers at least a first portion of the laptop screen from a first vantage point;
   a second mirror attached to the frame near a second end of the frame, disposed in the frame at a position and angle which, when the frame is coupled to the laptop screen, place the second mirror near a second corner at the top of the laptop screen at an angle that reflects an image of a plane in front of the laptop screen that covers at least a second portion of the screen from a second vantage point different than the first vantage point;
   wherein at least a part of the second portion of the laptop screen overlaps the first portion of the laptop screen in front of a center of the laptop screen;
   a third mirror attached to the frame at a location that will position the third mirror in front of the laptop webcam at an angle that deflects a view of the webcam downward;
   a view splitter attached to the frame at a location that will position the view splitter below the third mirror and below the laptop webcam, that splits the view of the camera to include views of the first mirror and the second mirror,
   wherein the webcam receives images that include the plane in front of the laptop screen from two different vantage points and conveys information of the images to the laptop processor; and
   wherein the laptop processor:
      processes the images to detect a position and movement of an object within the plane in front of the laptop screen;
      from the detected position and movement, calculates corresponding x and y coordinates of the detected position and movements;
      generates cursor image information corresponding to the calculated coordinates; and
      causes the generated cursor image to display on the screen and track the motion of the object in the plane in front of the laptop screen to realize a virtual mouse.

9. The system of claim 8, further comprising at least one knob coupled to the frame for adjusting a position of the frame on the laptop screen.

10. The system of claim 8, further comprising a laser coupled to the frame at a location that does not interfere with the views reflected to the laptop webcam.

11. The system of claim 10, further comprising a plurality of laser beam splitting mirrors attached to the frame, configured to define the plane based on static reflections of the split laser beam.

12. The system of claim 10, further comprising a motor attached to the frame that causes a source of laser light to sweep through an angle to define the plane.

13. The system of claim 12, further comprising a mirror coupled to the motor, wherein the plane is defined by a laser beam reflecting off of the mirror as the source of laser light.

14. The system of claim 1, wherein:
the radiation is em radiation,
the sensor is a camera, and
the system is configured to sense the location and movement of the object through a pane of glass.

* * * * *